United States Patent [19]

Stahlhofen

[11] 4,439,511
[45] Mar. 27, 1984

[54] LIGHT-SENSITIVE MIXTURE BASED ON O-NAPHTHOQUINONE DIAZIDE ESTER OF CONDENSATE OF BISPHENOL AND FORMALDEHYDE AND LIGHT-SENSITIVE COPYING MATERIAL PREPARED THEREFROM

[75] Inventor: Paul Stahlhofen, Wiesbaden, Fed. Rep. of Germany

[73] Assignee: Hoechst Aktiengesellschaft, Frankfurt am Main, Fed. Rep. of Germany

[21] Appl. No.: 393,788

[22] Filed: Jun. 30, 1982

[30] Foreign Application Priority Data

Jul. 14, 1981 [DE] Fed. Rep. of Germany ....... 3127754

[51] Int. Cl.³ .......................... G03C 1/54; G03C 1/60
[52] U.S. Cl. .................................. 430/165; 430/192; 430/193; 430/302; 260/141
[58] Field of Search ............... 430/190, 192, 193, 165, 430/302; 260/141 D

[56] References Cited

U.S. PATENT DOCUMENTS

| | | | |
|---|---|---|---|
| 3,046,118 | 7/1962 | Schmidt | 430/193 |
| 3,046,120 | 7/1962 | Schmidt et al. | 96/33 |
| 3,188,210 | 6/1965 | Fritz et al. | 430/193 |
| 3,647,443 | 3/1972 | Rauner et al. | 430/192 |
| 4,266,001 | 5/1981 | Buhr et al. | 430/193 |
| 4,306,011 | 12/1981 | Uehara et al. | 430/190 |
| 4,308,368 | 12/1981 | Kubo et al. | 430/190 |

FOREIGN PATENT DOCUMENTS 1330932  9/1973  United Kingdom .

*Primary Examiner*—Charles L. Bowers, Jr.
*Attorney, Agent, or Firm*—Schwartz, Jeffery, Schwaab, Mack, Blumenthal & Koch

[57] ABSTRACT

A light-sensitive mixture is described, which contains, as the light-sensitive compound, a 1,2-naphthoquinone-2-diazidesulfonic acid ester of the general formula I

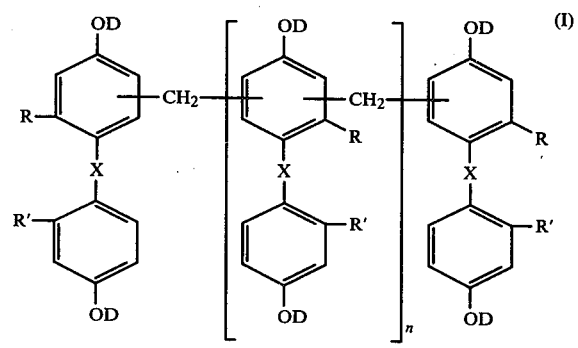

in which R and R' denote hydrogen atoms or lower alkyl groups, X denotes a saturated alkylene, hydroxyalkylene or dihydroxyalkylene group having 6 to 18 carbon atoms, D denotes the 1,2-naphthoquinone-2-diazide-5-sulfonyl radical or the 1,2-naphthoquinone-2-diazide-4-sulfonyl radical and n denotes a number from 1 to 20. The new quinone diazides produce printing plates which are capable of long printing runs and have good resistance to developer and good flexibility of the printing stencil.

14 Claims, No Drawings

LIGHT-SENSITIVE MIXTURE BASED ON O-NAPHTHOQUINONE DIAZIDE ESTER OF CONDENSATE OF BISPHENOL AND FORMALDEHYDE AND LIGHT-SENSITIVE COPYING MATERIAL PREPARED THEREFROM

BACKGROUND OF THE INVENTION

The present invention relates to a positive-working, light-sensitive mixture which contains, as the light-sensitive compound, a 1,2-naphthoquinone-2-diazidesulfonic acid ester of a condensation product formed from a bisphenol and formaldehyde. The light-sensitive mixture is intended particularly for the production of planographic printing plates.

Naphthoquinonediazidesulfonic acid esters of phenolic resins are known from German Pat. No. 865,860 (=U.S. Pat. No. 3,046,120). However, the copying materials obtained using these compounds are insufficiently sensitive to light and their resistance to developers and their elasticity are too low.

German Offenlegungsschrift No. 2,146,166 (=British Pat. No. 1,330,932) describes similar esters which have been prepared from condensation products of bisphenols with formaldehyde, in which the two phenolic nuclei of the bisphenol units are linked by oxygen or sulfur atoms or by sulfoxy, sulfonyl or optionally substituted methylene groups. The methylene groups can be substituted by lower alkyl groups, carboxyalkyl groups and phenyl groups. Methyl and ethyl groups are described as illustrative embodiments of lower alkyl groups. The compounds produce layers which have a good resistance to developers and good mechanical strength. They are used primarily for the production of etch resists. However, relatively strong alkaline solutions are required to develop them, and relief images made therewith have a tendency to become brittle, which manifests itself in a disadvantageous manner in the case of long printing runs in offset printing.

German Patent Application P 3,124,936.1 describes 1,2-naphthoquinone-2-diazidesulfonic acid esters of bis-hydroxyarylalkanes.

SUMMARY OF THE INVENTION

Therefore, it is an object of the present invention to provide an improved light-sensitive mixture.

Aother object of the invention resides in providing a light-sensitive mixture based on higher-molecular naphthoquinonediazidesulfonic acid esters which produces layers having high sensitivity to light, good capacity for being developed and good resistance to developers and good elasticity and oleophilic properties.

It is also an object of the invention to provide an improved light-sensitive copying material.

A further object of the invention is to provide an improved planographic printing plate.

In accomplishing the foregoing objects, there has been provided in accordance with the present invention a light-sensitive mixture comprising a light-sensitive compound selected from a 1,2-naphthoquinone-2-diazidesulfonic acid ester of a condensation product formed from a bisphenol and formaldehyde, wherein the ester corresponds to the formula I

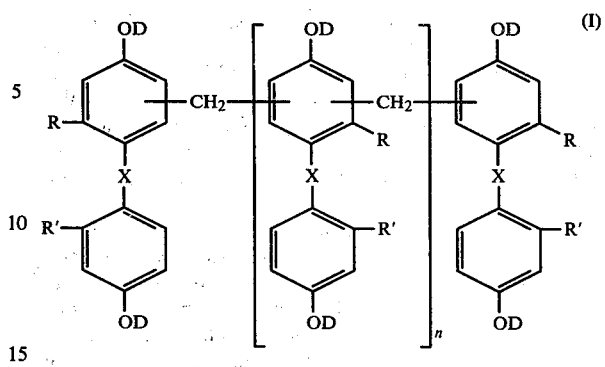

wherein R and R' denote hydrogen atoms or lower alkyl groups, X denotes a saturated alkylene, hydroxyalkylene or dihydroxyalkylene group having 6 to 18 carbon atoms, D denotes the 1,2-naphthoquinone-2-diazide-5-sulfonyl radical or the 1,2-naphthoquinone-2-diazide-4-sulfonyl radical and n denotes a number from 1 to 20. The mixture preferably also includes a binder which is insoluble in water, but is soluble or at least swellable in aqueous alkaline solutions.

Also provided according to the invention is a light-sensitive copying material comprising a layer support and a light-sensitive layer containing the light-sensitive compound described above.

Further objects, features and advantages of the present invention will become apparent from the detailed desecription of preferred embodiments which follows.

DETAILED DESCRIPTION OF PREFERRED EMBODIMENTS

The invention relates to a light-sensitive mixture which contains, as the light-sensitive compound, a 1,2-naphthoquinone-2-diazidesulfonic acid ester of a condensation product formed from a bisphenol and formaldehyde. The mixture according to the invention comprises an ester which corresponds to the general formula I

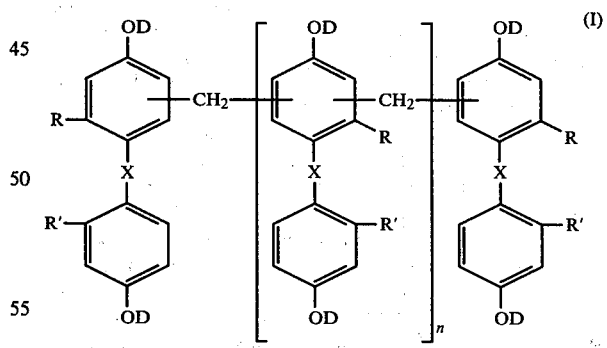

in which R and R' denote hydrogen atoms or lower alkyl groups, X denotes a saturated alkylene, hydroxyalkylene or dihydroxyalkylene group having 6 to 18 carbon atoms, D denotes the 1,2-naphthoquinone-2-diazide-5-sulfonyl radical or the 1,2-naphthoquinone-2-diazide-4-sulfonyl radical and n denotes a number from 1 to 20.

The alkylene group X can be linear or branched and can contain up to 2 OH groups. Compounds which are preferred are those in which X contains 8 to 18 carbon atoms. If R and R' denote alkyl groups, these groups have 1 to 4, preferably 1, carbon atoms. D is preferably a 1,2-naphthoquinone-2-diazide-5-sulfonyl radical.

In general, the compounds of the formula I are prepared by reacting a bisphenol-formaldehyde condensation product with a 1,2-naphthoquinone-2-diazidesulfonyl chloride. A bisphenol is designated in this case as a compound in which two mononuclear hydroxyaryl radicals are linked with one another via a connecting link.

The bisphenol-formaldehyde resin used for the reaction with the naphthoquinonediazidesulfonyl chloride is a modified phenol novolac resin which is prepared by subjecting a bis-(4-hydroxyaryl)-alkane or bis-(4-hydroxyaryl)-hydroxyalkane to a condensation reaction with formaldehyde. The formaldehyde is added in an amount of about 1 mole per mole of bisphenol. However, it is also possible to use an excess, if appropriate up to 2 moles of formaldehyde for 1 mole of bisphenol.

The condensation reaction is advantageously carried out in organic solvents, such as ethanol, 1,4-dioxane or chlorobenzene, in the presence of acid condensation agents, such as hydrochloric acid, oxalic acid or p-toluenesulfonic acid, at a reaction temperature of about 70° to 120° C.

Examples of bis-(4-hydroxyaryl)-alkanes which are suitable in accordance with the present invention are mentioned below: 1,10-bis-(4-hydroxyphenyl)-decane, 1,12-bis-(4-hydroxyphenyl)-dodecane, 1,8-bis-(4-hydroxyphenyl)-octane, 1,12-bis-(4-hydroxyphenyl)-octadecane, 1,12-bis-(4-hydroxy-2-methylphenyl)-dodecane, 1,1-bis-(4-hydroxyphenyl)-octane, 1,1-bis-(4-hydroxy-2-methylphenyl)-hexane, 1,1-bis-(4-hydroxyphenyl)-dodecane, 1,1-bis-(4-hydroxy-2-methylphenyl)-dodecane and 3,4-bis-(4-hydroxyphenyl)-hexane-3,4-diol.

The alkylenebisphenols are prepared by heating long-chain diols with 2 moles of phenol at 120° to 170° C. for 3 to 7 hours, in the presence of dehydrating compounds, such as boron trifluoride or zinc chloride. Compounds of this type are described in U.S. Pat. No. 2,321,620 and in *J. Am. Chem. Soc.* 62, (1940), page 413. The corresponding polymethylenebisphenols can also be obtained by reducing the two keto groups of polymethylenediketophenols, which are prepared by reacting higher paraffindicarboxylic acids with phenols (*Chem. Ber.* 74, page 1,772). The preparation of 1,1-bis-(4-hydroxyaryl)-alkanes is effected by subjecting 2 moles of phenol to a condensation reaction with 1 mole of a higher aliphatic aldehyde in the presence of hydrochloric acid. Corresponding compounds are described in *J. Am. Chem. Soc.* 54 (1932), page 4,325.

Linking of the o-quinonediazidesulfonyl groups to the phenolic groups of the bisphenolformaldehyde resins is effected by reacting the latter with a 1,2-naphthoquinone-2-diazidesulfonyl chloride analogously to known processes. Compounds in which all the phenolic groups have been esterified are normally preferred as the light-sensitive component in the copying layers. However, the phenolic groups can also be only partly esterified, if this is rendered necessary by the properties of the light-sensitive resins for copying technology, for example, if the solubility in aqueous alkaline developers is otherwise not adequate.

The general manner for preparing a light-sensitive bis-(4-hydroxyaryl)-alkane/formaldehyde resin is described below. A mixture composed of equimolar quantities of a bis-(4-hydroxyaryl)-alkane and formaldehyde in the form of a 37% strength formalin solution is dissolved, if necessary, in the required quantity of hot ethanol, 2 ml of concentrated hydrochloric acid are added and the mixture is heated to a boil under reflux for 1 to 4 hours. It can also be advantageous to use dioxane instead of ethanol, to use paraformaldehyde instead of a 37% strength formalin solution and to use p-toluenesulfonic acid instead of the hydrochloric acid. When the condensation reaction is complete, part of the solvent is removed by distillation and the remainder of the reaction mixture is poured slowly into 10 times its volume of water, while stirring vigorously. The precipitated resin is washed thoroughly with water and dried at about 100° C. in a rotary evaporator or in a vacuum drying cabinet.

The esterification of the phenolic OH groups with o-naphthoquinonediazidesulfonic acid is effected by dissolving the bis-(4-hydroxyaryl)-alkane/formaldehyde condensation product in the required quantity of dioxane or acetone and adding the equivalent quantity of o-naphthoquinonediazidesulfonyl chloride which is required for the esterification of the phenolic groups. A 1.5 molar excess of triethylamine, as a tertiary base, is added slowly, preferably dropwise, at 30° C., and the batch is then kept at 30° C. for a further two hours, while stirring. The hydrochloride of the tertiary base is then filtered off from the reaction solution, and the filtrate is then poured slowly, and with good stirring, into 10 times its volume of water, the pH being kept at a value between 3 and 6 by prior addition of aqueous hydrochloric acid. The diazo compound which has been precipitated is filtered off with suction, washed until it is neutral and dried in vacuo at room temperature.

The concentration of the new naphthoquinonediazidesulfonic acid esters in the light-sensitive layer can vary within relatively wide limits. In general, the proportion is from about 3 to 50%, preferably between 7 and 25%, relative to the weight of the solids content of the light-sensitive mixture.

The light-sensitive mixtures according to the invention also preferably contain a polymeric, water-insoluble, resin-like binder which is soluble in the solvents used for the mixture according to the invention and which is also soluble, or can at least be swelled, in aqueous alkalis.

The novolac condensation resins which have proved suitable in many positive-working copying materials based on naphthoquinonediazides have also turned out to be particularly useful and advantageous as an additive in the mixtures according to the invention which contain the new naphthoquinonediazidesulfonic acid esters. They promote the strong differentiation between the exposed and unexposed portions of the layer when the latter is developed. Especially suitable are the more highly condensed resins containing substituted phenols, for example, cresols, as the partner with formaldehyde in the condensation reaction. Further binders which are soluble in alkali or can be swelled in alkali and which should be mentioned are natural resins, such as shellac and colophony, and synthetic resins, such as copolymers formed from styrene and maleic anhydride or copolymers of acrylic acid or methacrylic acid, particularly with acrylic or methacrylic acid esters.

The nature and amount of the alkali-soluble resin can vary, depending on the use. The proportion of resin is preferably between about 95 and 50%, particularly preferably from about 90–65% by weight of the total solids content. In addition, it is also possible to concomitantly use numerous other resins, preferably epoxides and vinyl polymers, such as polyvinyl acetates, polyacrylates, polyvinyl acetals, polyvinyl ethers and polyvinylpyrrolidones, and copolymers of the monomers on which these vinyl polymers are based. The most advantageous proportion of these resins depends on the requirements of technical performance in use and on the effect on the developing conditions and, in general, is not more than 20% by weight of the alkali-soluble resin. For special requirements, such as flexibility, adhesion, gloss, coloration and color change and the like, the light-sensitive mixture can also contain, additionally, small quantities of substances such as polyglycols, cellulose derivatives, such as ethylcellulose, wetting agents, dyestuffs, adhesion promoters and finely divided pigments, and, if required, UV absorbers.

The mixtures are generally dissolved in a solvent in order to coat a suitable layer support. The choice of solvents must be such as to suit the coating process envisaged, the layer thickness and the drying conditions. Suitable solvents for the mixture according to the invention are ketones, such as methyl ethyl ketone, chlorinated hydrocarbons, such as trichloroethylene and 1,1,1-trichloroethane, alcohols, such as n-propanol, ethers, such as tetrahydrofuran, alcohol-ethers, such as ethylene glycol monoethyl ether and esters, such as butyl acetate. It is also possible to use mixtures which additionally can also contain, for special purposes, solvents such as acetonitrile, dioxane or dimethylformamide. In principle, it is possible to use any solvent which does not react irreversibly with the components in the layer. Partial ethers of glycols, in particular ethylene glycol monomethyl ether, are particularly preferred.

In most cases, metals are used as layer supports for layer thicknesses below approximately 10 $\mu$m. The following can be employed for offset printing plates: bright-rolled, mechanically or electrochemically roughened and, if appropriate, anodized aluminum which can, additionally, also be pretreated chemically, for example, with polyvinylphosphonic acid, silicates, phosphates, hexafluorozirconates or hydrolyzed tetraethyl orthosilicate; and also multi-metal plates composed, for example, of Al/Cu/Cr or of brass/chromium. For the production of relief printing plates, the mixtures according to the invention can be applied to zinc or magnesium plates and to commercially available microcrystaline alloys thereof for single-stage etching processes, and also to etchable plastics, such as polyoxymethylene. The mixtures according to the invention are suitable for gravure printing forms or screen printing forms because of their good adhesion and resistance to etching on copper and nickel surfaces. The mixtures according to the invention can also be used as photoresists in the production of printed circuit boards and in chemical milling. Other supports, such as wood, paper, ceramics, textiles and other metals are also suitable for further applications.

Supports which are preferred for layers over 10 $\mu$m thick are plastic films, which are then used as temporary supports for transfer layers. Polyester films, for example, films composed of polyethylene terephthalate, are preferred for this purpose and for color test films. Polyolefin films, such as polypropylene, are also suitable, however.

The support material is coated in a known manner by spin-coating, spraying, dipping or application by means of rollers, slot dies or doctor blades or by castor application. Finally, the coating of, for example, printed circuit boards, glass or ceramics and silicon discs can also be effected by transferring a layer from a temporary support. Exposure is carried out using the light sources which are customary in the art. Irradiation with electrons or lasers also constitutes a possible means of forming an image.

The aqueous alkaline solutions of graded alkalinity used for developing preferably have a pH within the range from 10–13 and can also contain minor quantities of organic solvents or wetting agents. These solutions remove the areas of the copying layer which have been affected by light, and thus produce a positive image of the original.

The light-sensitive mixtures according to the invention are preferably used in the production of printing forms, i.e, in particular, offset forms and auto-type gravure printing and screen printing forms, and in photoresist compositions and dry resists.

The light-sensitive layers which are produced using the new compounds possess a high practical sensitivity to light, together with good film formation on the customary support materials, and also an improved elasticity and resistance to alkaline developers. The preferred compounds themselves are distinguished by good solubility in the customary solvents, by a strongly oleophilic character and by good compatability with the remaining constituents of the copying layer.

The invention is illustrated in greater detail by means of the examples which follow, in which parts by weight and parts by volume are in the same relationship as the g to the cc. Unless otherwise specified, percentages are percentages by weight.

EXAMPLE 1

An electrolytically roughened and anodized aluminum plate having an oxide layer weighing 3.0 g/m$^2$ was coated with a solution of:

1.00 part by weight of the esterification product formed from 8 parts by weight of 1,1-bis-(4-hydroxy-2-methylphenyl)-dodecane/formaldehyde resin and 10.7 parts by weight of 1,2-naphthoquinone-2-diazide-5-sulfonyl chloride, 6.20 parts by weight of a cresol/formaldehyde novolac having a softening point of 105°–120° C. as specified in DIN 53,181, 0.12 part by weight of 4-(p-tolylmercapto)-2,5-diethoxy-benzenediazonium hexafluorophosphate, and 0.06 part by weight of Crystal Violet in 40 parts by weight of ethylene glycol monomethyl ether and 50 parts by weight of tetrahydrofuran.

The pre-sensitized material thus prepared, which had a light-sensitive layer weighing 2.50 g/m$^2$, was exposed imagewise under a transparent positive original and was then developed with the following solution:

5.3 parts by weight of sodium metasilicate.9H$_2$O, 3.4 parts by weight of trisodium phosphate.12H$_2$O, and 3.0 part by weight of anhydrous sodium dihydrogen phosphate in 91.0 parts by weight of water.

As a result of being developed, the portions of the copying layer which had been affected by light were removed, leaving the unexposed image areas on the layer support. About 250,000 satisfactory prints were produced in an offset machine from the printing form thus prepared. The printing stencil was distinguished by excellent elasticity, oleophilic character, resistance to developer and adhesion to the support.

Further coating solutions, by means of which similar results were obtained, are indicated in the examples which follow. Unless a separate note is made, the preparation and procesing of the printing plates obtained in these examples correspond to the conditions described in Example 1.

EXAMPLE 2

An electrolytically roughened and anodized aluminum plate was coated with a solution of:
1.10 parts by weight of the esterification product formed from 8.0 parts by weight of 1,1-bis-(4-hydroxy-2-methylphenyl)-dodecane/formaldehyde resin and 10.7 parts by weight of 1,2-naphthoquinone-2-diazide-5-sulfonyl chloride,
6.10 parts by weight of the novolac indicated in Example 1,
0.12 part by weight of 4-(p-tolylmercapto)-2,5-diethoxy-benzenediazonium hexafluorophosphate,
0.07 part by weight of Crystal Violet in
40 parts by weight of ethylene glycol monomethyl ether and
50 parts by weight of tetrahydrofuran.

Before the application of the light-sensitive copying layer, the anodized aluminum plate had been treated with an aqueous solution of polyvinylphosphonic acid, as described in German Pat. No. 1,621,478.

EXAMPLE 3

An electrolytically roughened and anodized aluminum plate, which had been subjected to after-treatment with an aqueous solution of polyvinylphosphonic acid, was coated with a solution of:
1.10 parts by weight of the esterification product formed from 16.4 parts by weight of 3,4-bis-(4-hydroxyphenyl)-hexane-3,4-diol/formaldehyde resin and 26.8 parts by weight of 1,2-naphthoquinone-2-diazide-5-sulfonyl chloride,
6.20 parts by weight of the novolac indicated in Example 1,
0.12 part by weight of 4-(p-tolylmercapto)-2,5-diethoxy-benzenediazonium hexafluorophosphate, and
0.07 part by weight of Crystal Violet in
40 parts by weight of ethylene glycol monomethyl ether and
50 parts by weight of tetrahydrofuran.

EXAMPLE 4

An electrolytically roughened and anodized aluminum plate was coated with a solution of:
1.10 parts by weight of the esterification product formed from 37.6 parts by weight of 1,1-bis-(4-hydroxyphenyl)-dodecane/formaldehyde resin and 53.6 parts by weight of 1,2-naphthoquinone-2-diazide-5-sulfonyl chloride,
6.00 parts by weight of the novolac indicated in Example 1,
0.15 part by weight of 1,2-naphthoquinone-2-diazide-4-sulfonyl chloride,
0.10 part by weight of 2,3,4-trihydroxybenzophenone, and
0.07 part by weight of Crystal Violet in
40 parts by weight of ethylene glycol monomethyl ether and
50 parts by weight of tetrahydrofuran.

EXAMPLE 5

An electrolytically roughened and anodized aluminum plate which had an oxide layer weighing 3.0 g/m² and which had been treated with polyvinylphosphonic acid as in Example 2, was coated with a solution of:
1.10 parts by weight of the esterification product formed from 33.8 parts by weight of 1,10-bis-(4-hydroxyphenyl)-decane/formaldehyde resin and 53.6 parts by weight of 1,2-naphthoquinone-2-diazide-5-sulfonyl chloride,
6.20 parts by weight of the novolac indicated in Example 1,
0.12 part by weight of 4-(p-tolylmercapto)-2,5-diethoxy-benzenediazonium hexafluorophosphate, and
0.06 part by weight of Crystal Violet in
40 parts by weight of ethylene glycol monomethyl ether and
50 parts by weight of tetrahydrofuran.

What is claimed is:

1. A light-sensitive mixture, comprising:
a light-sensitive compound selected from a 1,2-naphthoquinone-2-diazide-sulfonic acid ester of a condensation product formed from a bisphenol and formaldehyde, wherein the ester corresponds to the formula I

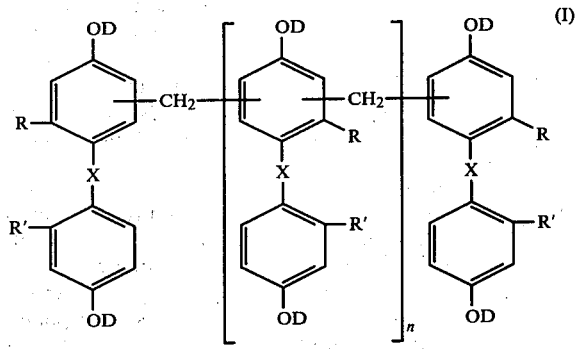

in which R and R' denote hydrogen atoms or lower alkyl groups, X denotes a saturated alkylene, hydroxyalkylene or dihydroxyalkylene group having 6 to 18 carbon atoms, D denotes the 1,2-naphthoquinone-2-diazide-5-sulfonyl radical or the 1,2-naphthoquinone-2-diazide-4-sulfonyl radical and n denotes a number from 1 to 20; and
a binder which is insoluble in water, but is soluble or at least swellable in aqueous alkaline solutions, wherein said ester and said binder are present in amounts sufficient to promote, upon exposure to light, a differentiation of solubility between exposed and unexposed portions of said mixture in dilute aqueous-alkaline solutions.

2. A light-sensitive mixture as claimed in claim 1, wherein the binder comprises a novolac.

3. A light-sensitive mixture as claimed in claim 1, comprising 3 to 50% by weight of the ester of the formula I, relative to its content of non-volatile constituents.

4. A light-sensitive mixture as claimed in claim 1, wherein said ester comprises 1,10-bis-(4-hydroxyphenyl)-decane, 1,12-bis-(4-hydroxyphenyl)-dodecane, 1,8-bis-(4-hydroxyphenyl)-octane, 1,12-bis-(4-hydroxyphenyl)-octadecane, 1,12-bis-(4-hydroxy-2-methylphenyl)-dodecane, 1,1-bis-(4-hydroxyphenyl)-octane, 1,1-bis-(4-hydroxy-2-methylphenyl)-hexane, 1,1-bis-(4-hydroxyphenyl)-dodecane, 1,1-bis-(4-hydroxy-2-methylphenyl)-dodecane or 3,4-bis-(4-hydroxyphenyl)-hexane-3,4-diol.

5. A light-sensitive mixture as claimed in claim 1, wherein X denotes an alkylene group having at least 6 carbon atoms separating the two phenol rings to which X is attached.

6. A light-sensitive mixture as claimed in claim 5, wherein X is selected from 1,10-dodecane, 1,8-octane, 1,12octadecane and 1,12-dodecane.

7. A light-sensitive copying material as claimed in claim 1, wherein X denotes 1,1-bis-(4,-hydroxy-2-methylphenyl)-dodecane.

8. A light-sensitive material as claimed in claim 1, wherein X denotes 1,10-bis-(4-hydroxyphenyl)-dodecane.

9. A light-sensitive copying material, comprising:

a layer support; and a light-sensitive layer containing:

a light-sensitive compound selected from 1,2-naphthoquinone-2-diazidesulfonic acid ester of a condensation product formed from a bisphenol and formaldehyde, wherein the ester corresponds to the formula I

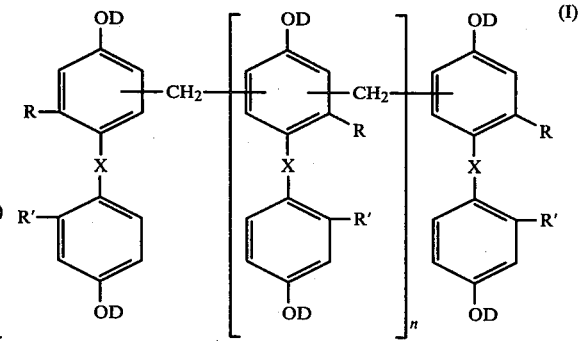

in which R and R' denote hydrogen atoms or lower alkyl groups, X denotes a saturated alkylene, hydroxyalkylene or dihydroxyalkylene group having 6 to 18 carbon atoms, D denotes the 1,2-naphthoquinone-12-diazide-5-sulfonyl radical or the 1,2-naphthoquinone-2-diazide-4-sulfonyl radical and n denotes a number from 1 to 20, said ester being present in an amount sufficient to cause, upon exposure to light, a difference in solubilities between exposed and unexposed areas of said layer in dilute aqueous-alkaline solutions; and a binder which is insoluble in water, but is soluble or at least swellable in aqueous alkaline solutions and is present in an amount to promote said differentiation of solubilities.

10. A light-sensitive copying material as claimed in claim 9, wherein the layer support comprises aluminum.

11. A light-sensitive copying material as claimed in claim 10, wherein the aluminum has been electrolytically roughened and anodically oxidized.

12. A light-sensitive copying material as claimed in claim 9, wherein said ester comprises 1,10-bis-(4-hydroxyphenyl)-decane, 1,12-bis-(4-hydroxyphenyl)-dodecane, 1,8-bis-(4-hydroxyphenyl)-octane, 1,12-bis-(4-hydroxyphenyl)-octadecane, 1,12-bis-(4-hydroxy-2-methylphenyl)-dodecane, 1,1-bis-(4-hydroxyphenyl)-octane, 1,1-bis-(4-hydroxy-2-methylphenyl)-hexane, 1,1-bis-(4-hydroxyphenyl)-dodecane, 1,1-bis-(4-hydroxy-2-methylphenyl)-dodecane or 3,4-bis-(4-hydroxyphenyl)-hexane-3,4-diol.

13. A light-sensitive copying material as claimed in claim 9, wherein X denotes an alkylene group having at least 6 carbon atoms separating the two phenol rings to which X is attached.

14. A light-sensitive copying material as claimed in claim 13, wherein X is selected from 1,10-dodecane, 1,8-octane, 1,12-octadecane and 1,12-dodecane.

* * * * *